(12) United States Patent
Murray et al.

(10) Patent No.: US 10,446,491 B2
(45) Date of Patent: Oct. 15, 2019

(54) HYBRID INTERCONNECTS AND METHOD OF FORMING THE SAME

(71) Applicant: International Business Machines Corporation, Armonk, NY (US)

(72) Inventors: Conal E. Murray, Yorktown Heights, NY (US); Chih-Chao Yang, Glenmont, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 15/609,594

(22) Filed: May 31, 2017

(65) Prior Publication Data

US 2018/0012841 A1 Jan. 11, 2018

Related U.S. Application Data

(62) Division of application No. 15/202,656, filed on Jul. 6, 2016, now Pat. No. 9,748,173.

(51) Int. Cl.
*H01L 23/528* (2006.01)
*H01L 23/522* (2006.01)
(Continued)

(52) U.S. Cl.
CPC .... *H01L 23/5283* (2013.01); *H01L 21/76816* (2013.01); *H01L 21/76826* (2013.01); *H01L 21/76831* (2013.01); *H01L 21/76843* (2013.01); *H01L 21/76847* (2013.01); *H01L 21/76877* (2013.01); *H01L 21/76882* (2013.01); *H01L 23/5226* (2013.01); *H01L 23/53223* (2013.01); *H01L 23/53238* (2013.01); *H01L 23/53252* (2013.01); *H01L 23/53266* (2013.01)

(58) Field of Classification Search
CPC ............... H01L 23/5226; H01L 23/528; H01L 23/5283; H01L 23/53204; H01L 23/53209; H01L 21/76816; H01L 21/76831; H01L 21/76877; H01L 21/76882

See application file for complete search history.

(56) References Cited

U.S. PATENT DOCUMENTS 5,019,531 A 5/1991 Awaya et al.
5,134,460 A 7/1992 Brady et al.
(Continued)

OTHER PUBLICATIONS

List of IBM Patents or Patent Applications Treated as Related.

*Primary Examiner* — Syed I Gheyas
(74) *Attorney, Agent, or Firm* — Vazken Alexanian; Ryan, Mason & Lewis, LLP

(57) ABSTRACT

A method for manufacturing a semiconductor device includes forming a trench in at least one dielectric layer; and forming an interconnect structure in the trench, wherein forming the interconnect structure includes forming a first conductive layer on a bottom surface of the trench, and partially filling the trench, and forming a second conductive layer on the first conductive layer, and filling a remaining portion of the trench, wherein the second conductive layer comprises a different material from the first conductive layer, and wherein an amount of the first conductive layer in the trench is controlled so that an aspect ratio of the second conductive layer has a value that is determined to result in columnar grain boundaries in the second conductive layer.

14 Claims, 4 Drawing Sheets

(51) Int. Cl.
*H01L 23/532* (2006.01)
*H01L 21/768* (2006.01)

(56) References Cited

U.S. PATENT DOCUMENTS

| | | |
|---|---|---|
| 5,714,418 A | 2/1998 | Bai et al. |
| 6,077,780 A | 6/2000 | Dubin |
| 6,140,228 A | 10/2000 | Shan et al. |
| 6,198,170 B1 | 3/2001 | Zhao |
| 6,277,728 B1 | 8/2001 | Ahn et al. |
| 6,288,449 B1 | 9/2001 | Bhowmik et al. |
| 6,380,082 B2 | 4/2002 | Huang et al. |
| 6,727,176 B2 | 4/2004 | Ngo et al. |
| 6,921,469 B2 | 7/2005 | Larsen |
| 7,956,463 B2 | 6/2011 | Yang et al. |
| 8,772,157 B2 | 7/2014 | Fang |
| 8,852,305 B2 | 10/2014 | Andersson et al. |
| 8,864,861 B2 | 10/2014 | Andersson et al. |
| 8,888,841 B2 | 11/2014 | Pandelidis et al. |
| 8,893,711 B2 | 11/2014 | Kennedy |
| 8,895,099 B2 | 11/2014 | Atanasoska et al. |
| 8,993,472 B2 | 3/2015 | Roller et al. |
| 9,005,769 B2 | 4/2015 | Lambert et al. |
| 9,017,762 B2 | 4/2015 | Rozak et al. |
| 9,023,486 B2 | 5/2015 | Nagaraj et al. |
| 9,031,184 B2 | 5/2015 | Cabrero et al. |
| 9,034,465 B2 | 5/2015 | Peters et al. |
| 9,034,479 B2 | 5/2015 | Nagaraj et al. |
| 9,190,323 B2 | 11/2015 | Zhang et al. |
| 2002/0137329 A1* | 9/2002 | Fang ............... H01L 21/76846 438/627 |
| 2005/0006770 A1* | 1/2005 | Sukharev ......... H01L 21/76846 257/758 |
| 2009/0297759 A1* | 12/2009 | Chanda ............ H01L 21/76877 428/83 |
| 2009/0321933 A1 | 12/2009 | McFeely et al. |
| 2014/0299988 A1 | 10/2014 | Cabral, Jr. et al. |
| 2014/0301861 A1 | 10/2014 | Bruce et al. |
| 2014/0324156 A1 | 10/2014 | Yin et al. |
| 2015/0129087 A1 | 5/2015 | Hintz |
| 2015/0132926 A1 | 5/2015 | D'Evelyn et al. |
| 2015/0206791 A1* | 7/2015 | Lin ................... H01L 21/76802 438/652 |

\* cited by examiner

HYBRID INTERCONNECTS AND METHOD OF FORMING THE SAME

TECHNICAL FIELD

The field generally relates to semiconductor devices and methods of manufacturing same and, in particular, to interconnects comprising different materials in order to result in columnar grain boundaries in upper conductive portions of the interconnects.

BACKGROUND

When scaling for next generation semiconductor devices in connection with increased miniaturization, including, for example, very-large-scale integration (VLSI), back end of line (BEOL) resistance can be a critical issue affecting device performance. In interconnect metallurgy, the formation of metallization with a microstructure that minimizes grain boundaries that lie parallel to current flow mitigates the effects of electromigration-induced voiding.

As scaling of device dimensions in microelectronic circuitry has dictated a need for smaller interconnect trench widths, the corresponding aspect ratios of these trenches have increased in order to maximize a cross-section of the interconnect. Conventional fabrication of such trenches, which uses copper electroplating, can produce small grains whose grain boundaries are more susceptible to electromigration effects.

As the copper (Cu) interconnect dimensions become smaller, resistivity of the interconnect increases dramatically. This becomes a challenge for the development of current and future semiconductor technology nodes. It has been observed that copper interconnect structures possessing columnar metallic thin films are superior to those with a polycrystalline structure with respect to mechanical and electrical properties, providing increased mechanical strength and electrical conductivity (i.e., lower resistivity).

SUMMARY

According to an exemplary embodiment of the present invention, a method for manufacturing a semiconductor device includes forming a trench in at least one dielectric layer, conformally depositing a first conductive layer on a top surface of the at least one dielectric layer, and on sidewall and bottom surfaces of the trench, reflowing the first conductive layer to increase an amount of the first conductive layer in the trench, and partially fill the trench with the first conductive layer, conformally depositing a liner layer on the first conductive layer on the top surface of the at least one dielectric layer, and on the sidewall and bottom surfaces of the trench, forming a second conductive layer on the liner layer on the top surface of the at least one dielectric layer, and filling a remaining portion of the trench, and removing the first conductive layer, the liner layer and the second conductive layer from the top surface of the at least one dielectric layer, wherein an aspect ratio of the second conductive layer in the trench has a value that is determined to result in columnar grain boundaries in the second conductive layer.

According to an exemplary embodiment of the present invention, a semiconductor device includes at least one dielectric layer, a trench formed in the at least one dielectric layer, and an interconnect structure formed in the trench, wherein the interconnect structure includes a first conductive layer on a bottom surface of the trench, and partially filling the trench, and a second conductive layer on the first conductive layer, and filling a remaining portion of the trench, wherein the second conductive layer comprises a different material from the first conductive layer, and wherein the second conductive layer comprises columnar grain boundaries.

According to an exemplary embodiment of the present invention, a method for manufacturing a semiconductor device includes forming a trench in at least one dielectric layer; and forming an interconnect structure in the trench, wherein forming the interconnect structure includes forming a first conductive layer on a bottom surface of the trench, and partially filling the trench, and forming a second conductive layer on the first conductive layer, and filling a remaining portion of the trench, wherein the second conductive layer comprises a different material from the first conductive layer, and wherein an amount of the first conductive layer in the trench is controlled so that an aspect ratio of the second conductive layer has a value that is determined to result in columnar grain boundaries in the second conductive layer.

These and other exemplary embodiments of the invention will be described in or become apparent from the following detailed description of exemplary embodiments, which is to be read in connection with the accompanying drawings.

BRIEF DESCRIPTION OF THE DRAWINGS

Exemplary embodiments of the present invention will be described below in more detail, with reference to the accompanying drawings, of which.

DETAILED DESCRIPTION

Figure 1:
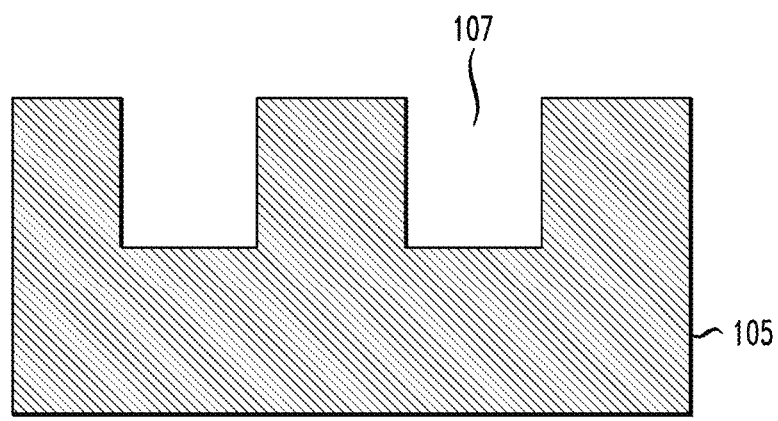
FIG. 1 is a cross-sectional view illustrating fabrication of a semiconductor device and showing formation of trenches in a dielectric, according to an exemplary embodiment of the present invention.

Exemplary embodiments of the invention will now be discussed in further detail with regard to semiconductor devices and methods of manufacturing same and, in particular, to hybrid interconnects comprising different conductive layers in order to result in columnar grain boundaries in upper conductive layers of the interconnects.

It is to be understood that the various layers and/or regions shown in the accompanying drawings are not drawn to scale, and that one or more layers and/or regions of a type commonly used in, for example, complementary metal-oxide semiconductor (CMOS), fin field-effect transistor (FinFET), metal-oxide-semiconductor field-effect transistor (MOSFET) and/or other semiconductor devices may not be explicitly shown in a given drawing. This does not imply that the layers and/or regions not explicitly shown are omitted from the actual devices. In addition, certain elements may be left out of particular views for the sake of clarity and/or simplicity when explanations are not necessarily focused on the omitted elements. Moreover, the same or similar reference numbers used throughout the drawings are used to denote the same or similar features, elements, or structures, and thus, a detailed explanation of the same or similar features, elements, or structures will not be repeated for each of the drawings.

The semiconductor devices and methods for forming same in accordance with embodiments of the present invention can be employed in applications, hardware, and/or electronic systems. Suitable hardware and systems for implementing embodiments of the invention may include, but are not limited to, personal computers, communication networks, electronic commerce systems, portable communications devices (e.g., cell and smart phones), solid-state media storage devices, functional circuitry, etc. Systems and hardware incorporating the semiconductor devices are contemplated embodiments of the invention. Given the teachings of embodiments of the invention provided herein, one of ordinary skill in the art will be able to contemplate other implementations and applications of embodiments of the invention.

The embodiments of the present invention can be used in connection with semiconductor devices that may require, for example, CMOSs, MOSFETs and/or FinFETs. By way of non-limiting example, the semiconductor devices can include, but are not limited to CMOS, MOSFET and FinFET devices, and/or semiconductor devices that use CMOS, MOSFET and/or FinFET technology.

As used herein, "height" refers to a vertical size of an element (e.g., a layer, trench, hole, etc.) in the cross-sectional views measured from a bottom surface to a top surface of the element, and/or measured with respect to a surface on which the element is directly on. Conversely, a "depth" refers to a vertical size of an element (e.g., a layer, trench, hole, etc.) in the cross-sectional and three-dimensional views measured from a top surface to a bottom surface of the element.

As used herein, "lateral," "lateral side," "lateral surface" refers to a side surface of an element (e.g., a layer, opening, etc.), such as a left or right side surface in the drawings.

As used herein, "width" or "length" refers to a size of an element (e.g., a layer, trench, hole, etc.) in the drawings measured from a side surface to an opposite surface of the element.

As used herein, terms such as "upper", "lower", "right", "left", "vertical", "horizontal", "top", "bottom", and derivatives thereof shall relate to the disclosed structures and methods, as oriented in the drawing figures. For example, as used herein, "vertical" refers to a direction perpendicular to a substrate in the cross-sectional views, and "horizontal" refers to a direction parallel to a substrate in the cross-sectional views.

As used herein, unless otherwise specified, terms such as "on", "overlying", "atop", "on top", "positioned on" or "positioned atop" mean that a first element is present on a second element, wherein intervening elements may be present between the first element and the second element. As used herein, unless otherwise specified, the term "directly" used in connection with the terms "on", "overlying", "atop", "on top", "positioned on" or "positioned atop" or the term "direct contact" mean that a first element and a second element are connected without any intervening elements, such as, for example, intermediary conducting, insulating or semiconductor layers, present between the first element and the second element.

The microstructure of certain metal-based interconnects, such as copper-based interconnects, depends strongly on the aspect ratio (line height/line width) of the interconnect. Interconnects with relatively small aspect ratios are more conducive for generating a columnar microstructure. However, a reduced cross-sectional area associated with lower aspect ratio structures limits the corresponding conductance of the interconnect.

As used herein, a "columnar microstructure" or "columnar grain boundaries" can refer to an arrangement of grains that span the entire thickness of the interconnect in the vertical or substantially vertical direction and appear as columns, such that the grain boundaries run from the top to bottom surfaces (or vice versa) of the interconnect and do not lie parallel to these surfaces.

Embodiments of the present invention relate to a structure and method for creating a hybrid interconnect structure, in which the lower portion is comprised of a metal layer, such as, for example, aluminum (Al) or silver (Ag), and an upper portion comprises another metal layer, such as, for example, Cu, Al, tungsten (W), cobalt (Co), ruthenium (Ru) or alloys thereof. The effective aspect ratio of the upper portion is lower than that of a monolithic interconnect. By filling in a portion that would normally be occupied by non-hybrid single material interconnect, the lower portion (e.g., Al) reduces the aspect ratio of the upper portion (e.g., Cu) by reducing a line height of the upper portion. By reducing the aspect ratio, the lower portion allows the creation of a columnar microstructure in the upper portion of the interconnect. In addition, the lower portion of the interconnect provides an additional conduction path for current flow through the interconnect to maintain a required conducting area. According to a non-limiting embodiment of the present invention, a liner layer (also referred to herein as a barrier layer) resides between the upper and lower portions of the interconnect to mitigate diffusion between the lower and upper portions and to allow for seed layer/electroplating deposition of the upper portion.

According to a non-limiting embodiment of the present invention, trenches are created in one or more dielectric insulating layers, a lower conductive layer is deposited in the trenches on an oxygen enriched dielectric surface, followed by a reflow annealing step so that the lower conductive layer partially fills an interconnect trench. A thickness of the deposited bottom layer is chosen so that the remaining portion of the interconnect trench has an aspect ratio between about 0.5 to about 2.5. A barrier layer and conductive metal seed layer are then deposited, followed by electroplating to completely fill the remaining portions of the trenches. The structure is then annealed to promote columnar grain growth and generate a columnar microstructure in the upper conductive portion of the interconnect.

In accordance with a non-limiting embodiment of the present invention, the upper conductor comprises Cu with a columnar microstructure, and the bottom conductor comprises Al. An average grain size of the upper conductive portion can be greater than the critical dimension (i.e., line width) of the interconnect, and an aspect ratio of the upper portion is less than 2.5. Accordingly, grain boundaries within the upper portion of the interconnect are columnar, extending to end at top and bottom surfaces of the upper portion of the interconnect.

FIG. 1 is a cross-sectional view illustrating fabrication of a semiconductor device and showing formation of trenches in a dielectric, according to an exemplary embodiment of the present invention. Referring to FIG. 1, one or more trenches 107 are formed in a dielectric layer 105, such as, for example, silicon dioxide ($SiO_2$), carbon-doped silicon oxide (SiCOH), SiLK® dielectrics, and porous forms of these low-k dielectric films. The trenches 107 can be defined using, for example, lithography techniques, and then reactive ion etching (ME) to open the trenches 107. The trenches 107 can be formed through a plurality of dielectric layers 105.

According to an embodiment, the dielectric 105 and the trenches 107 are part of a back end of line (BEOL) interconnect structure of an integrated circuit where the devices, including, but not limited to, transistors, capacitors, and resistors are interconnected with metallization layers (e.g., wiring) on a wafer. As can be understood by one of ordinary skill in the art, the dielectric layer 105 can be on a semiconductor substrate (not shown), with intervening layers between the dielectric layer 105 and the substrate. A semiconductor substrate can be, for example, a bulk substrate or a silicon-on-insulator (SOI) substrate including a buried insulating layer, such as, for example, a buried oxide or nitride layer located on an upper surface of the semiconductor substrate. The substrate may comprise semiconductor material including, but not limited to, Si, SiGe, SiC, SiGeC or other like semiconductor. In addition, multiple layers of the semiconductor materials can be used as the semiconductor material of the substrate. A plurality of devices can be on the substrate, such as, for example, transistors, capacitors, and resistors.

Although discussed in the context of BEOL, the embodiments of the present invention are not necessarily limited thereto, and may include other applications, such as, for example, middle of line (MOL) or other interconnects.

Figure 2:
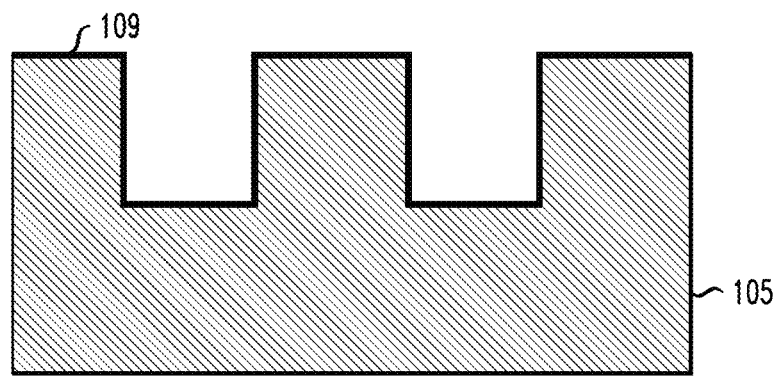
FIG. 2 is a cross-sectional view illustrating fabrication of a semiconductor device and showing surface modification to form an oxygen enriched dielectric surface, according to an exemplary embodiment of the present invention.

FIG. 2 is a cross-sectional view illustrating fabrication of a semiconductor device and showing surface modification to form an oxygen enriched dielectric surface, according to an exemplary embodiment of the present invention. Referring to FIG. 2, an oxygen enriched dielectric surface 109 is formed on a top surface, and lining the sidewall and bottom surfaces of the trenches 107 of the dielectric 105. Surface modification to form the oxygen enriched dielectric surface 109 includes plasma or thermal treatment processes at a temperature of about 80° C. to about 400° C. using an ozone or oxygen ambient.

Figure 3:
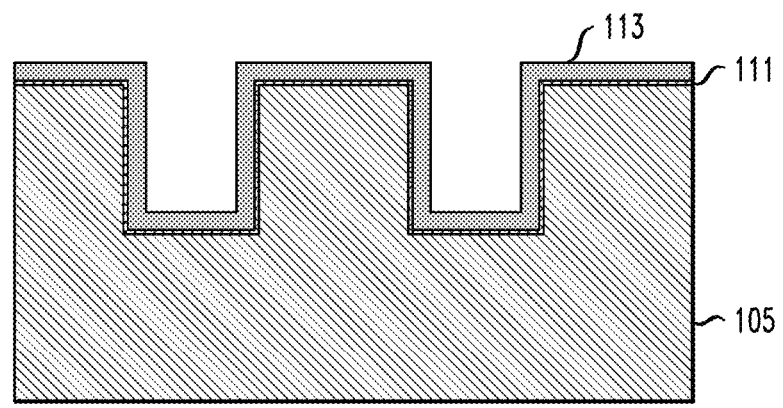
FIG. 3 is a cross-sectional view illustrating fabrication of a semiconductor device and showing metal deposition, according to an exemplary embodiment of the present invention.

FIG. 3 is a cross-sectional view illustrating fabrication of a semiconductor device and showing metal deposition, according to an exemplary embodiment of the present invention. Referring to FIG. 3, a conductive metal, such as, for example, aluminum (Al) or silver (Ag) is conformally deposited on the oxygen enriched surface 109, using deposition techniques, including, but not necessarily limited to, atomic layer deposition (ALD) or physical vapor deposition (PVD). The conductive layer reacts with the oxygen enriched surface 109 to form a layer of metal oxide 111, for example, aluminum oxide ($Al_2O_3$) or silver oxide ($Ag_2O$) under the metal layer 113 of, for example, aluminum or silver. Other conductive metals (described below) may be used that have a similar resistivity to the material (e.g., Cu) of the upper portion of the interconnect.

Figure 4:
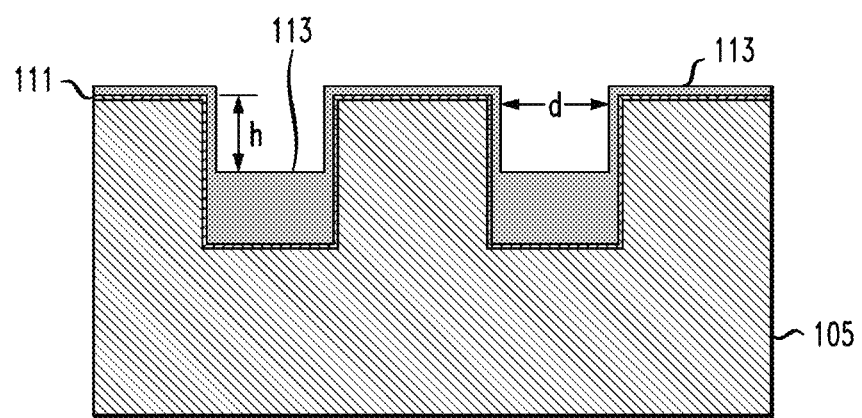
FIG. 4 is a cross-sectional view illustrating fabrication of a semiconductor device and showing metal reflow, according to an exemplary embodiment of the present invention.

FIG. 4 is a cross-sectional view illustrating fabrication of a semiconductor device and showing metal reflow, according to an exemplary embodiment of the present invention. Referring to FIG. 4, a reflow process is performed, for example, at a temperature of about 200° C. to about 500° C. using a nitrogen, or a hydrogen and nitrogen ambient, so as to partially fill the trenches 107 with the metal 113. As shown in FIG. 4, the height of the reflowed metal layer 113 with respect to a bottom surface of the trench 107 is adjusted so that the remaining portion of the trench where the upper conductive layer 120 (see FIGS. 7 and 8) is to be formed has an aspect ratio which is conducive for creating a columnar microstructure (e.g., columnar grain boundaries) in the upper conductive layer 120. For example, in connection with copper and other conductive materials, an aspect ratio less than about 2.5, such as for example, about 1.0 or about 2.0 results in columnar microstructures in copper or the other conductive materials. Aspect ratios greater than about 2.5 can result in microstructures that are not columnar in copper and the other conductive materials. According to an embodiment, if the upper conductive layer 120 of an interconnect is to be formed of copper, the height of the bottom conductor 113 (e.g., Al) in the lower portion of the trench 107 is adjusted so that the aspect ratio of the upper copper layer will be less than 2.5 when filling a remaining portion of the trench 107. The aspect ratio in this case will be calculated from formula (1), where:

$$h/d<2.5 \qquad (1)$$

As can be seen in FIG. 4, h (height) is the remaining vacant area of the trench in a vertical direction between a top surface of the metal 113 to a top of the trench 107 and d (width) is a remaining vacant width between metal layers 113 on left and right sides of the trench 107. In accordance with an embodiment of the present invention, a thickness of the metal oxide 111 and metal layer 113 on each of the left and right sides of the trench 107 can be about 5 nm or less. In addition, when calculating a height of a reflowed metal layer 113 with respect to a bottom surface of the trench 107 to arrive at a desired aspect ratio of the upper portion 120 (see FIGS. 7 and 8) of the interconnect, an allowance is made for a thickness of liner layer 115 (see FIGS. 7 and 8), which will be formed between the metal layer 113 and the upper conductive layer 120. As explained further herein, a thickness of the liner layer 115 can be in the range of about 5 to about 20 nm.

According to an embodiment, a left to right side width of a trench can be, for example, less than about 100 nm, but is not necessarily limited thereto. In a basic example, assuming a trench width of 100 nm, a combined thickness of layers 111 and 113 of 5 nm on each of left and right sides of the trench, and a liner layer 115 thickness of 10 nm on each of left and right sides of the trench, d would be 70 nm, allowing for the combined thickness of 15 nm for layers 111, 113 and 115 on each of left and right sides of the trench. Accordingly, given equation (1), h/70<2.5, so that h<175 nm. Therefore, depending on the overall depth of the trench 107, a height of layer 113 on the oxide layer 111 with respect to a bottom of the trench 107, and adjusted for the thickness of liner layer 115, must be sufficient so that the resulting height of the upper portion 120 will be less than 175 nm.

Figure 5:
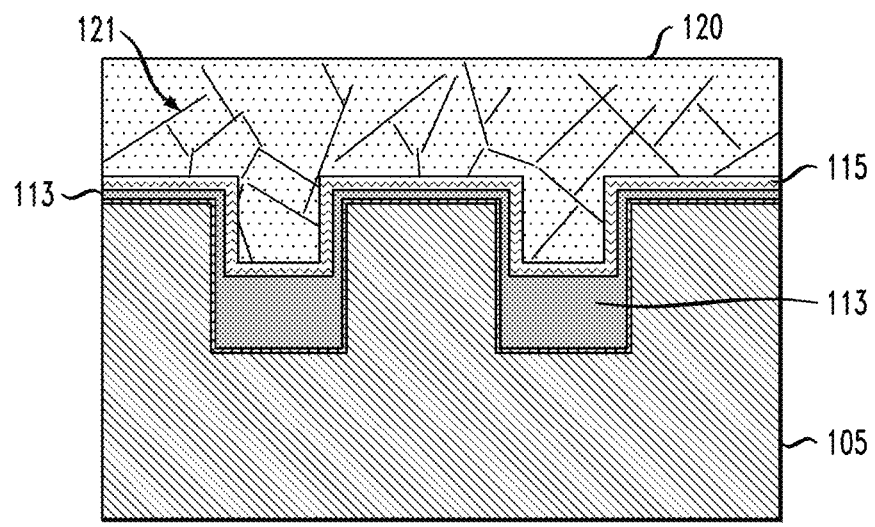
FIG. 5 is a cross-sectional view illustrating fabrication of a semiconductor device and showing deposition of liner and conducting materials, according to an exemplary embodiment of the present invention.

FIG. 5 is a cross-sectional view illustrating fabrication of a semiconductor device and showing deposition of liner and conducting materials, according to an exemplary embodiment of the present invention. Referring to FIG. 5, the liner layer 115 including, but not necessarily limited to, tantalum (Ta), titanium (Ti), cobalt (Co), ruthenium (Ru), tungsten (W), their nitrides, or other alloy materials, is conformally deposited on the exposed portions of the metal layer 113 on the top surface of the dielectric 105, and on the sidewall and bottom surfaces of the trenches 107. According to an embodiment, the liner layer 115 is deposited using deposition techniques, including, but not necessarily limited to, sputtering, ALD, or PVD. As noted above, a thickness of the liner layer 115 can be in the range of about 5 nm to about 20 nm.

Then, the upper conductive layer 120, including, but not necessarily limited to, copper (Cu), aluminum (Al), tungsten (W), cobalt (Co), ruthenium (Ru) or their alloy materials, is deposited using, for example, an electroplating technique. The electroplating technique includes depositing a conductive metal seed layer on the liner layer 115, followed by electroplating to completely fill the remaining portions of the trenches 107. As can be seen, the upper conductive layer 120 is deposited to a height above the top surface of the dielectric 105, and is planarized in a subsequent step (see FIG. 7). Other methods for deposition of the upper conductive layer 120 can include, for example, ALD and chemical vapor deposition (CVD).

Figure 6:
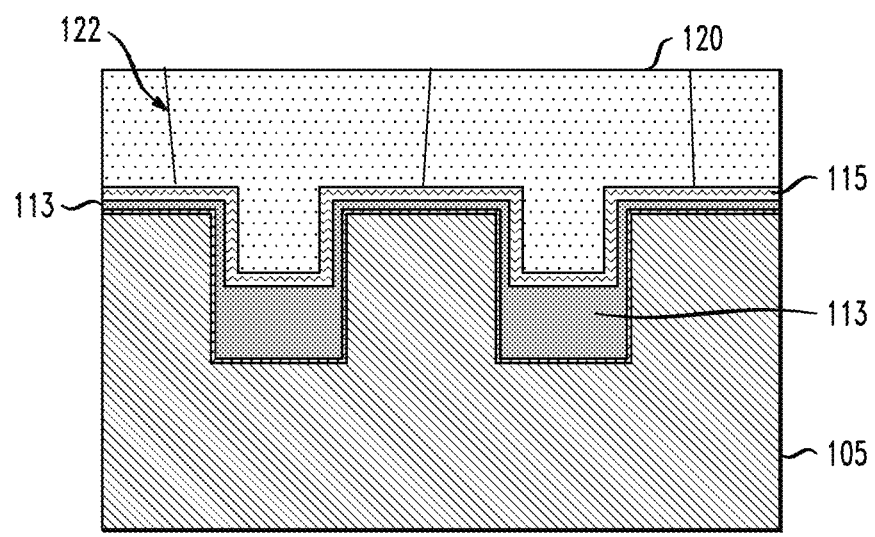
FIG. 6 is a cross-sectional view illustrating fabrication of a semiconductor device and showing a result of an annealing process, according to an exemplary embodiment of the present invention.

As can be seen in FIG. 5, the upper conductive layer 120 may include polycrystalline type (non-columnar) grain boundaries 121, which are removed or, at the very least minimized, in a subsequent thermal annealing step. FIG. 6 is a cross-sectional view illustrating fabrication of a semiconductor device and showing a result of an annealing process, according to an exemplary embodiment of the present invention. Referring to FIG. 6, in accordance with an embodiment of the present invention, a thermal annealing process is performed on the structure of FIG. 5. The thermal annealing process is performed at a temperature in the range of about 100° C. to about 500° C. using, for example, a nitrogen ambient, or other ambient to minimize the presence of oxygen. The thermal anneal provides sufficient energy at temperatures of 100° C. to about 500° C. to help atoms in the upper conductive layer 120 (e.g., Cu) to diffuse, promoting grain growth and eliminating grain boundaries 121 that have a component that runs parallel to or close to parallel to the top or bottom surface of the film, thereby resulting in the columnar type grain boundaries 122 shown in FIG. 6.

Figure 7:
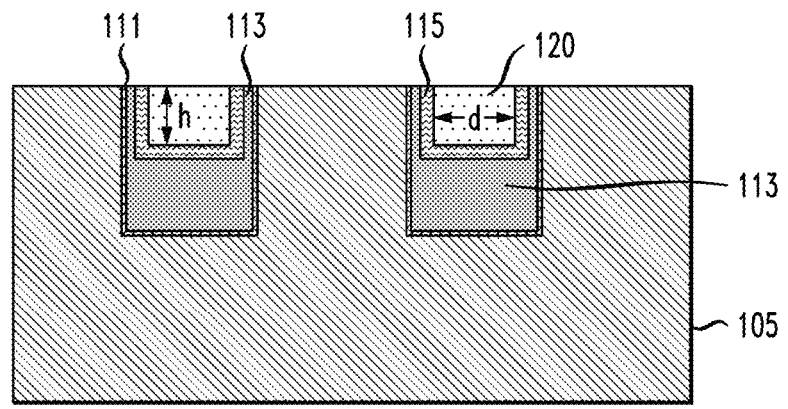
FIG. 7 is a cross-sectional view illustrating fabrication of a semiconductor device and showing planarization, according to an exemplary embodiment of the present invention.

FIG. 7 is a cross-sectional view illustrating fabrication of a semiconductor device and showing planarization, according to an exemplary embodiment of the present invention. Referring to FIG. 7, the layers 111, 113, 115 and 120 on the top surface of the dielectric 105 polished off, using for example, a chemical mechanical planarization (CMP) process to planarize the top surface and result in structure shown in FIG. 7. As shown in FIG. 7, the upper conductive layer 120 has a height h and a width d such that the aspect ratio h/d is less than a value that would result in a columnar microstructure for the upper conductive layer 120 (e.g., <2.5 in the case of Cu). The values of h and d represent a height and width of the upper conductive layer 120 with respect to outer surfaces of the liner layer 115.

Figure 8:
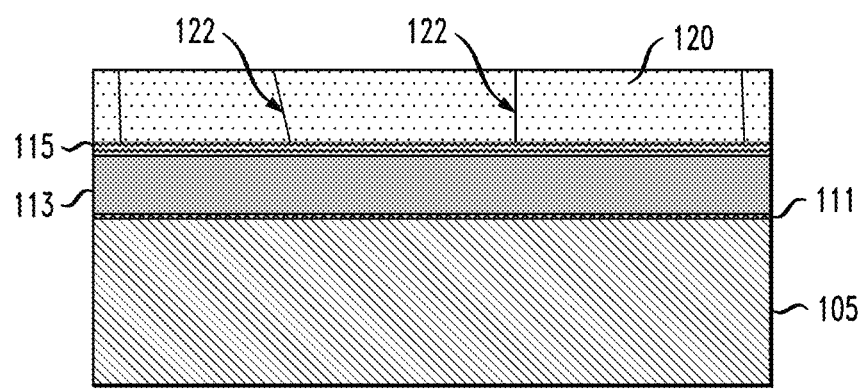
FIG. 8 is a cross-sectional view taken along a line perpendicular to the cross-sectional views in FIGS. 1-7 and illustrating a structure of an interconnect region in a semiconductor device, according to an exemplary embodiment of the present invention.

FIG. 8 is a cross-sectional view taken along a line perpendicular to the cross-sectional views in FIGS. 1-7 and illustrating a structure of an interconnect region in a semiconductor device, according to an exemplary embodiment of the present invention. FIG. 8 shows a longitudinal view of the configuration of the hybrid interconnect in a trench, including a bottom oxide layer 111 on the dielectric 105, a lower conductive layer 113, a liner layer 115 and the upper conductive layer 120 including columnar grain boundaries 122.

Although illustrative embodiments of the present invention have been described herein with reference to the accompanying drawings, it is to be understood that the invention is not limited to those precise embodiments, and that various other changes and modifications may be made by one skilled in the art without departing from the scope or spirit of the invention.

We claim:

1. A semiconductor device, comprising:
   at least one dielectric layer;
   a trench formed in the at least one dielectric layer;
   an interconnect structure formed in the trench, wherein the interconnect structure comprises:
      a first conductive layer comprising a bottom portion on a bottom surface of the trench and upper side portions on lateral sidewall surfaces of the trench, and partially filling the trench;
      a second conductive layer on the first conductive layer, and filling part of a remaining portion of the trench; and
      a liner layer between the first conductive layer and the second conductive layer;
   wherein the liner layer comprises one or more of cobalt, ruthenium, tungsten and nitrides thereof;
   wherein the second conductive layer comprises a different material from the first conductive layer;
   wherein a thickness of the bottom portion of the first conductive layer is greater than a thickness of the upper side portions of the first conductive layer; and
   wherein the second conductive layer comprises columnar grain boundaries; and
   an oxide layer on the bottom surface and on the lateral sidewall surfaces of the trench, wherein the oxide layer is positioned between, and in contact with, the at least one dielectric layer and the bottom and the upper side portions of the first conductive layer;
   wherein the oxide layer is distinct from the at least one dielectric layer;
   wherein an aspect ratio of the second conductive layer has a value that is determined to result in the columnar grain boundaries in the second conductive layer;
   wherein the aspect ratio is defined as a height of the second conductive layer divided by a width of the second conductive layer; and
   wherein the aspect ratio is less than or equal to 1.

2. The semiconductor device according to claim 1, wherein the second conductive layer comprises copper.

3. The semiconductor device according to claim 1, wherein the second conductive layer is positioned between the upper side portions of the first conductive layer.

4. The semiconductor device according to claim 3, wherein the liner layer is between the upper side portions of the first conductive layer and the second conductive layer.

5. The semiconductor device according to claim 1, wherein the first conductive layer comprises silver.

6. The semiconductor device according to claim 1, wherein the oxide layer comprises a different material from a material of the at least one dielectric layer.

7. The semiconductor device according to claim 1, wherein the liner layer is a single layer.

8. A semiconductor device, comprising:
   at least one dielectric layer;
   a trench formed in the at least one dielectric layer; and an interconnect structure formed in the trench, wherein the interconnect structure comprises:
  a first conductive layer comprising a bottom portion on a bottom surface of the trench and upper side portions on lateral sidewall surfaces of the trench, and partially filling the trench;
  a second conductive layer on the first conductive layer and partially filling the trench; and
  a liner layer between the first conductive layer and the second conductive layer;
wherein the liner layer comprises one or more of cobalt, ruthenium, tungsten and nitrides thereof;
wherein the second conductive layer comprises a different material from the first conductive layer;
wherein a thickness of the bottom portion of the first conductive layer is greater than a thickness of the upper side portions of the first conductive layer; and
wherein the second conductive layer comprises columnar grain boundaries; and
an oxide layer on the bottom surface and on the lateral sidewall surfaces of the trench, wherein the oxide layer is positioned between and in contact with, the at least one dielectric layer and the bottom and the upper side portions of the first conductive layer;
wherein the oxide layer is distinct from the at least one dielectric layers;
wherein an aspect ratio of the second conductive layer has a value that is determined to result in the columnar grain boundaries in the second conductive layer;
wherein the aspect ratio is defined as a height of the second conductive layer divided by a width of the second conductive layer; and
wherein the aspect ratio is less than or equal to 1.

9. The semiconductor device according to claim 8, wherein the second conductive layer comprises copper.

10. The semiconductor device according to claim 8, wherein the second conductive layer is positioned between the upper side portions of the first conductive layer.

11. The semiconductor device according to claim 10, wherein the liner layer is between the upper side portions of the first conductive layer and the second conductive layer.

12. The semiconductor device according to claim 8, wherein the first conductive layer comprises silver.

13. The semiconductor device according to claim 8, wherein the oxide layer comprises a different material from a material of the at least one dielectric layer.

14. The semiconductor device according to claim 8, wherein the liner layer is a single layer.

* * * * *